(12) United States Patent
Hamamoto et al.

(10) Patent No.: US 6,733,932 B2
(45) Date of Patent: May 11, 2004

(54) MASK LITHOGRAPHY DATA GENERATION METHOD

(75) Inventors: Takeshi Hamamoto, Tokyo (JP); Youji Tonooka, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 115 days.

(21) Appl. No.: 10/197,814

(22) Filed: Jul. 19, 2002

(65) Prior Publication Data

US 2003/0022078 A1 Jan. 30, 2003

(30) Foreign Application Priority Data

Jul. 30, 2001 (JP) ......................................... 2001-230438

(51) Int. Cl.[7] .................................................. G03F 9/00

(52) U.S. Cl. .............................. 430/5; 430/30; 430/296; 430/942

(58) Field of Search ............................. 430/5, 30, 296, 430/942

(56) References Cited

U.S. PATENT DOCUMENTS 6,117,600 A * 9/2000 Nakasuji ...................... 430/30

* cited by examiner

*Primary Examiner*—Christopher G. Young
(74) *Attorney, Agent, or Firm*—Young & Thompson

(57) ABSTRACT

An estimated pattern for forming a mask is divided into rectangles, a selected region is selected from the pattern, and, when a minute shape is present in the selected region, the selected region is redivided into a plurality of rectangles. The selected region is a region in which a gate electrode of a transistor, a contact, or a via hole is formed.

7 Claims, 9 Drawing Sheets

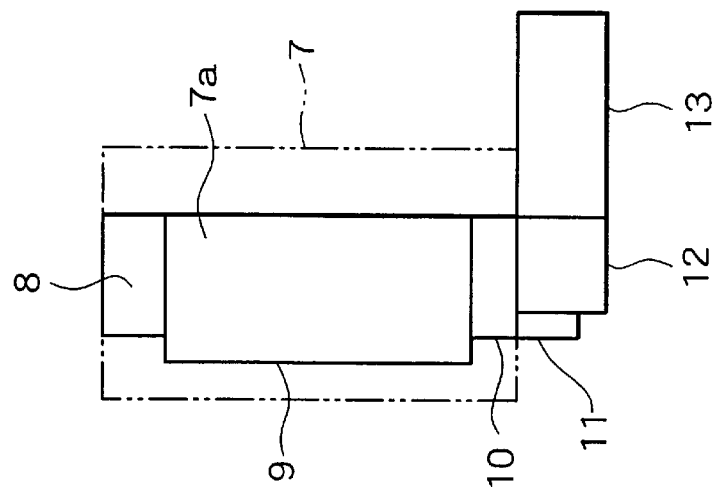
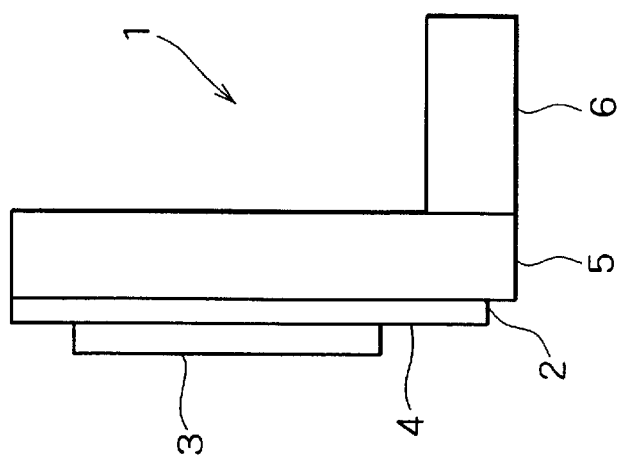
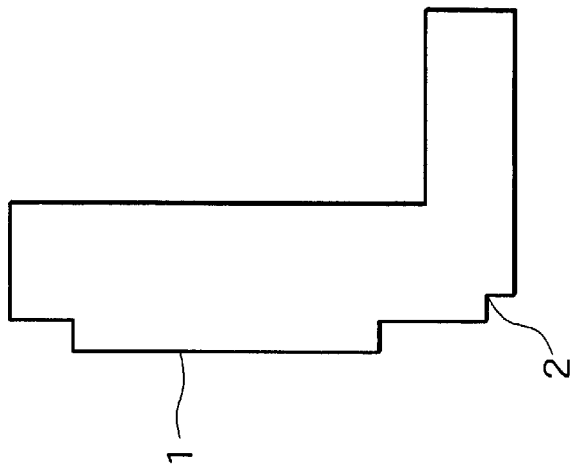

MASK LITHOGRAPHY DATA GENERATION METHOD

BACKGROUND OF THE INVENTION

1. Field of the Invention

The present invention relates to a mask lithography data generation method for manufacturing an electron beam exposure mask that is used when manufacturing a semiconductor device, and in particular to a mask lithography data generation method for lithography by a vector-type electron-beam exposing apparatus.

2. Description of the Related Art

During the manufacturing process of a semiconductor device, a process that forms the components of the semiconductor device by forming a pattern of a predetermined form in a thin conducting or insulating layer is performed as follows. First, a thin layer that is to be processed is formed. A resist is then formed as a layer on this thin layer and the resist is selectively exposed through electron beam (EB) lithography (wafer lithography) using a mask in which the predetermined pattern has been formed. After this, the resist is developed to selectively remove parts of the resist, thereby forming a resist pattern. The thin layer is then selectively removed by means such as etching with the resist pattern as a mask.

The mask used in wafer lithography mentioned above is also manufactured by EB lithography (mask lithography). In more detail, a resist is formed on a mask material, a pattern is drawn in the resist by an electron beam, and then the resist is developed to remove parts of the resist and so form a pattern. Means, such as etching or the like, is then used to selectively remove parts of the mask material, with the resist in which the pattern has been formed as a mask. By doing so, a mask in which a predetermined pattern has been formed is produced.

With the high integration of semiconductor devices in recent years, the patterns formed on wafers are becoming increasingly fine. As one example, the smallest dimensions for forming patterns are in the process of switching from 0.18 μm to 0.10 μm. As a result, the masks used of EB lithography need to be made increasingly fine.

When the masks used for EB lithography are made fine, however, there is the problem of the proximity effect causing decreases in the formation precision of the resist pattern. FIG. 1A is a plan view showing one example of a mask that is used during conventional EB lithography (wafer lithography), while FIG. 1B is a plan view showing the form of a resist pattern that is formed by this mask. FIG. 2 is a plan view showing the form of the mask after correction. As shown in FIG. 1A, the mask 61 is provided with an opening 62. The width A of the opening 62 is 400 nm, for example. When another opening, opening 63, is formed at a position next to the opening 62 and a resist pattern is formed by performing lithography using the mask 61 with a projection magnification on the wafer of (¼) times, for example, the form of the resist pattern 64, which corresponds to the opening 62, is not a resemblance 62a of the opening 62, and ends up narrower than the resemblance 62a, for example.

For this reason, the form of the opening 62 formed in the mask 61 is conventionally corrected in advance to become the opening 62b, as shown in FIG. 2. The form of the opening 62b is produced by adding a corrective part 62c to the original opening 62. The opening 62 may be 400 nm wide, for example, and the corrective part 62c may be 20 nm wide, for example. When lithography is performed at a projection magnification of (¼) times using this mask 61, in the resist pattern formed on the wafer, the width of the region corresponding to the opening 62 is 100 nm, and the width of the region corresponding to the corrective part 62c is 5 nm.

EB exposing apparatuses include raster-type EB exposing apparatuses that perform lithography by scanning an electron beam and vector-type EB exposing apparatuses that divide a pattern into rectangles and shoot an electron beam separately at each rectangle. Of these, vector-type EB exposing apparatuses are capable of drawing with higher precision, so that vector-type EB exposing apparatuses are used when producing a mask by forming a fine pattern in a mask material. In order to manufacture a mask using a vector-type EB exposing apparatus, it is necessary to generate mask lithography data, in which the pattern for forming the mask is divided into rectangles, in advance. A mask is then manufactured by performing EB lithography (mask lithography) on a mask material based on this mask lithography data.

FIG. 3A and FIG. 3B show a method of dividing the opening 62b. When EB lithography is performed using the mask 61 (see FIG. 2) in which the opening 62b has been formed, an electron beam is shot with the opening 62b having been divided into rectangles. As shown in FIG. 3A, one example of how the opening 62b can be divided divides the opening 62b into the opening 62 and the corrective part 62c. However, if the corrective part 62c is narrow, there is the problem that the width precision of the EB lithography falls.

FIG. 4A and 4B are graphs showing the influence of the width of a rectangle produced by the division on the EB output characteristics, with the horizontal axis showing positions in the horizontal direction in a divided rectangle and the vertical axis showing the EB output. FIG. 4A shows the case of a rectangle whose width X is large, while FIG. 4B shows the case of a rectangle whose width X is small. As shown in FIG. 4A, when the width X of a rectangle is large, for example, 25 nm or more on the wafer, an approximately equal EB output is obtained across the width direction. Conversely, as shown in FIG. 4B, when the width X of a rectangle is small, for example, below 25 nm on the wafer, the EB output at the ends of the rectangle is low, with the EB output in the central part of the rectangle also falling. This is to say, there is a drop in the EB output characteristics. For this reason, there is a drop in the width precision of the EB exposure, so that the formation precision of the mask pattern also falls, resulting in a drop in the formation precision for semiconductor devices.

Due to the above, it is necessary to shoot the electron beam having divided the opening 62b without forming a shape with a narrow width (hereafter referred to as a "minute shape"), such as that shown in FIG. 3A. As shown in FIG. 3B, dividing the opening 62b into the rectangles 68a, 68b, and 68c does not produce any minute shapes, so that there is no fall in the EB output characteristics. Conventionally, methods of generating lithography data that divide mask patterns in this way to avoid producing any minute shapes are used.

FIG. 5 is a block diagram showing a conventional mask lithography data generation apparatus. As shown in FIG. 5, the conventional mask lithography data generation apparatus 50 includes a rectangle division processing unit 52, a minute shape removal processing unit 53, and a mask lithography data converting unit 55. The following describes a conventional method of generating mask lithography data.

First, layout data 51 is generated. The layout data 51 is two-dimensional coordinate data showing the form of the opening 62b shown in FIG. 2, for example. Next, the layout data 51 is inputted into the rectangle division processing unit 52, and a rectangle division process is performed on the layout data 51. By doing so, a pattern corresponding to the opening 62b is divided as shown in FIG. 3A, for example, into a plurality of rectangles, or more specifically, the opening 62 and the corrective part 62c. At this point, the rectangle corresponding to the corrective part 62c has a narrow width, making it a minute shape.

Next, the layout data that has been subjected to the rectangle division process is inputted into the minute shape removal processing unit 53. By doing so, the pattern divided into rectangles as shown in FIG. 3A is redivided into rectangles as shown in FIG. 3B, so as to remove the minute shape (the part corresponding to the corrective part 62c) and generate "minute shapeless" data 54. After this, the minute shapeless data 54 is inputted into the mask lithography data converting unit 55, where the format of minute shapeless data 54 is converted into a format that can be recognized by a mask lithography apparatus (not shown in the drawings), thereby producing the mask lithography data 56. The mask lithography data 56 is inputted into the mask lithography apparatus, and lithography is performed with an electron beam based on the mask lithography data 56 to produce a mask.

However, the conventional technique given above suffers from the following problem. FIG. 6A shows the form of a resist pattern that is formed on a wafer, while FIG. 6B shows the form of an opening in a mask for forming the resist pattern 65 shown in FIG. 6A. It should be noted that the openings in the mask for forming the resist patterns 66 and 67 that are shown in FIG. 6A have been left out of FIG. 6B. As shown in FIG. 6A, the resist pattern 65 that is formed on the wafer is L-shaped. The part 65a of the resist pattern 65 is a region that corresponds to a gate electrode of a semiconductor device, for example. At a position close to the resist pattern 65, other resist patterns 66 and 67 are formed. As shown in FIG. 6B, the form of the pattern 41 for forming the mask that forms the resist pattern 65 is a combination of an L-shape 69, which is a resemblance the resist pattern 65, and corrective parts 70 and 71 for correcting the proximity effect.

FIG. 7A and FIG. 7B show the patterns of a mask, with FIG. 7A showing the pattern before division into rectangles and FIG. 7B showing the pattern after division into rectangles. The following describes the method whereby mask lithography data is generated using a conventional mask lithography data generation apparatus shown in FIG. 5, based on the pattern 41 shown in FIG. 6B.

First, as shown in FIG. 5, the layout data 51 is generated. The layout data 51 is two-dimensional coordinate data showing the form of the pattern 41. Next, the layout data 51 is inputted into the rectangle division processing unit 52. As a result, as shown in FIG. 7B, the pattern 41 is divided into the rectangles 43 to 46. At this point, the rectangles 43 and 44 are minute shapes.

Next, the layout data that has been subjected to the rectangle division process is inputted into the minute shape removal processing unit 53. Next, the minute shape removal processing unit 53 tries to remove the minute shapes from the pattern 41.

However, since the pattern 41 includes the minute corner part 42, no matter how the pattern 41 is divided into rectangles, a minute shape will always be produced, so that the minute shape removal processing unit 53 is unable to remove minute shapes from the pattern 41. This means that the rectangles 43 and 44 that are minute shapes are left in the mask lithography data 56, so that there is a drop in the EB output characteristics when lithography is performed using this mask lithography data 56. As a result, there is a drop in the precision of the lithography, and so a drop in the formation precision of the pattern formed in the mask.

This in turn causes a drop in the formation precision of the resist pattern 65 (see FIG. 6A) on the wafer. If, for example, the part 65a of the resist pattern 65 is a region corresponding to a gate electrode of a transistor in a semiconductor device, this means that there is a drop in the precision with which the gate electrode is formed. As a result, there is a drop in the characteristics, such as the operating speed, of the transistor.

SUMMARY OF THE INVENTION

It is an object of the present invention to provide a mask lithography data generation method for an electron beam exposure mask that is used when electron beam lithography is performed with a polygon-shaped pattern being divided into rectangles. This mask lithography data generation method is able to improve the formation precision of a pattern of the mask that corresponds to a region, in a semiconductor device, where formation precision is especially demanded, by removing minute shapes from the mask lithography data that corresponds to the region.

A mask lithography data generation method according to the present invention is a method for an electron beam exposure mask used in electron beam lithography where a polygon-shaped pattern is divided into rectangles. This mask lithography data generation method of the invention has the steps of: dividing layout data that shows a form of the pattern into selected region data for a selected region and unselected region data for an unselected region, the selected region being a part of the pattern that needs to be formed precisely and the unselected region being a part of the pattern that may be formed less precisely than the selected region; dividing the selected region data into a plurality of pieces of rectangle data by dividing the selected region into a plurality of rectangles whose shortest sides are longer than or equal to a reference value; and recombining the selected region data that has been divided into the plurality of pieces of rectangle data and the unselected region data.

With the present invention, the pattern for forming a mask is divided into a selected region and an unselected region, and the selected region is divided into a plurality of rectangles whose shortest sides have lengths that are longer than or equal to a reference value, so that even if minute shapes cannot be removed from the pattern as a whole, minute shapes can still be removed from the selected region. This means that by setting a region in a semiconductor device where formation precision is especially important, such as a region where a gate electrode of a transistor, a contact, a via hole, etc., is formed, as the selected region, a drop in the formation precision of this region can be prevented.

The mask lithography data generation method according to the present invention may also have a step of converting the recombined layout data into mask lithography data. By doing so, the layout data can be converted into data that can be recognized by a mask lithography apparatus.

It is preferable for the step that divides the selected region data into the plurality of pieces of rectangle data by dividing the selected region into the plurality of rectangles whose shortest sides are longer than or equal to a reference value to have the steps of: dividing the selected region data into a plurality of pieces of rectangle data by dividing the selected region into the plurality of rectangles using lines that join vertices of the selected region; combining some or all of the plurality of pieces of rectangle data to generate one or more larger pieces of rectangle data; and judging whether a length of a shortest sides in a rectangle represented by each of the larger pieces of rectangle data are longer than or equal to the predetermined value, with the step of dividing the selected region data into the plurality of pieces of rectangle data by dividing the selected region into the plurality of rectangles using the lines that join the vertices of the selected region, the step of generating the larger pieces of rectangle data, and the step of judging whether the length of the shortest sides are longer than or equal to the predetermined value being repeated when it is judged in the step of judging whether the length of the shortest sides are longer than or equal to the predetermined value that the length of the shortest side is below the predetermined value.

According to the present invention, in a mask lithography data generation method for an electron beam exposure mask used in electron beam lithography where a polygon-shaped pattern is divided into a plurality of patterns, minute shapes can be removed from mask lithography data that corresponds to a region of a semiconductor device where formation precision is especially required, so that the formation precision of the pattern of the mask that corresponds to this region can be improved.

BRIEF DESCRIPTION OF THE DRAWINGS

FIG. 1A is a plan view showing the form of a mask used in conventional EB lithography, while

FIG. 4A shows the case of a rectangle whose width X is large and FIG. 4B shows the case of a rectangle whose width X is small.

FIG. 6A is a plan view showing the form of a resist pattern that is formed on a wafer, while

FIG. 10A to FIG. 10C are plan views showing the pattern of a mask in the embodiment, with FIG. 10A showing the pattern before division into rectangles, FIG. 10B showing the pattern after division into rectangles, and FIG. 10C showing the pattern after the removal of the minute shapes.

DETAILED DESCRIPTION OF THE PREFERRED EMBODIMENT

Figure 8:
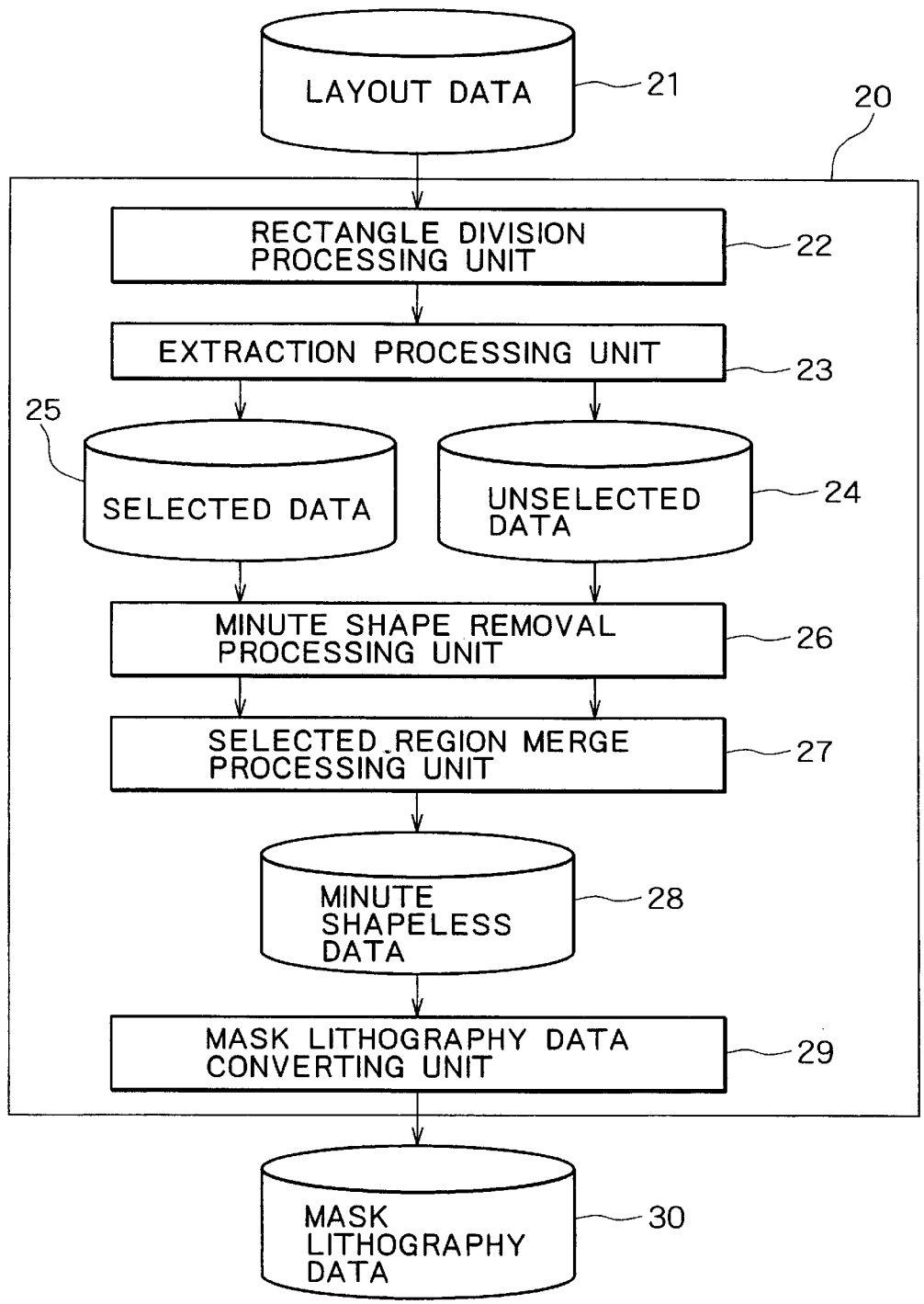
FIG. 8 is a block diagram showing a mask lithography data generation apparatus according to an embodiment of the present invention.
Figure 9:
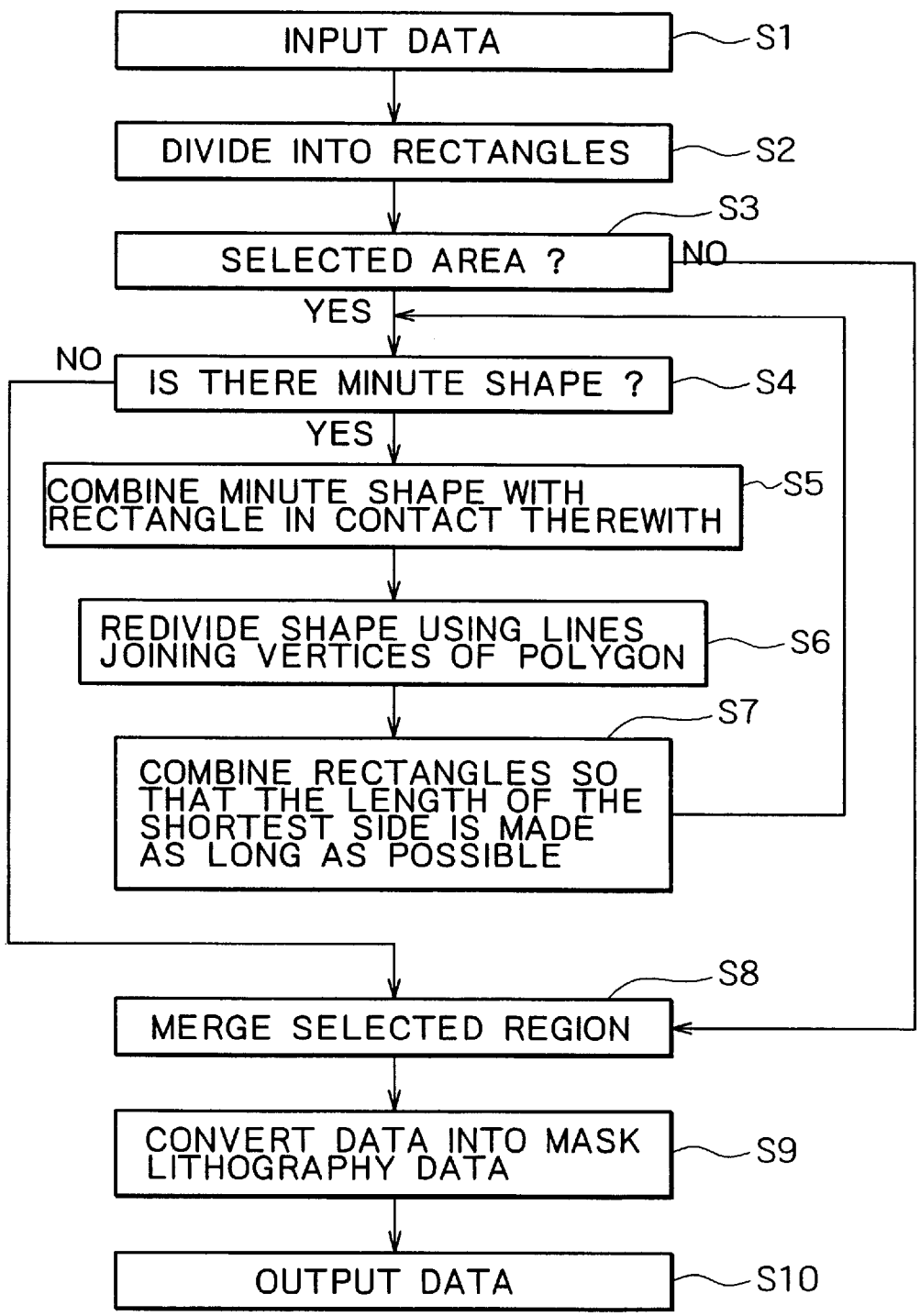
FIG. 9 is a flowchart showing the mask lithography data generation method according to the embodiment.

The following describes an embodiment of the present invention in detail with reference to the accompanying drawings. FIG. 8 is a block diagram showing a mask lithography data generation apparatus according to the present embodiment. FIG. 9 is a flowchart showing the mask lithography data generation method according to the present embodiment. Also, FIG. 10A to FIG. 10C show the pattern of a mask, with FIG. 10A showing the pattern before division into rectangles, FIG. 10B showing the pattern after division into rectangles, and FIG. 10C showing the pattern after the removal of the minute shapes.

As shown in FIG. 8, the mask lithography data generation apparatus 20 of the present embodiment is equipped with a rectangle division processing unit 22, an extraction processing unit 23 that indicates a selected region, a minute shape removal processing unit 26, a selected region merge processing unit 27, and a mask lithography data converting unit 29.

The rectangle division processing unit 22 receives an input of layout data 21 for a pattern 1 (see FIG. 10A) that is to be formed, divides the pattern 1 into a plurality of rectangles, and outputs the resulting rectangles to the extraction processing unit 23.

The extraction processing unit 23 selects a region that is part of the pattern 1 as a selected region 7 and divides the output data of the rectangle division processing unit 22 into selected data 25 and unselected data 24.

The minute shape removal processing unit 26 judges whether there is a minute shape in the selected region 7, and when there is, combines the minute shape with rectangles that are in contact with the minute shape either directly or via another rectangle, treats the combined result as a single figure, performs a redivision into rectangles using straight lines that join the vertices of this single figure, and forms a large combined rectangle by combining some or all of the plurality of rectangles produced by the redivision.

The selected region merge processing unit 27 combines the selected data 25 and the unselected data 24 to generate minute shapeless data 28 and outputs the minute shapeless data 28 to the mask lithography data converting unit 29.

The mask lithography data converting unit 29 converts the minute shapeless data 28 into a format that can be recognized by a mask lithography apparatus (not shown in the drawings) and so generates the mask lithography data 30.

The following describes the operation of the mask lithography data generation apparatus 20 of the present embodiment, which is to say, the mask lithography data generation method of the present embodiment.

Figure 1A:
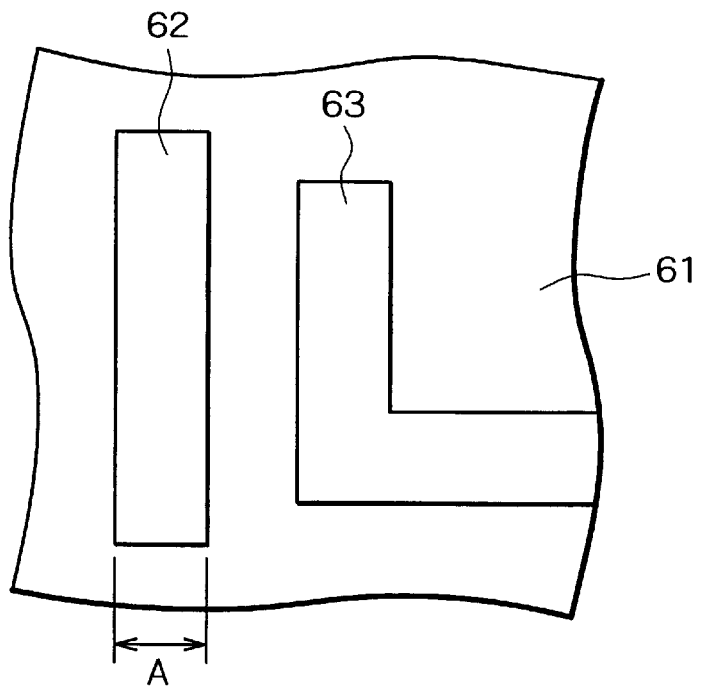
Figure 1B:
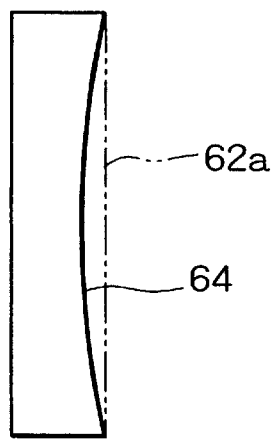
FIG. 1B is a plan view showing the form of the pattern formed by the mask.
Figure 2:
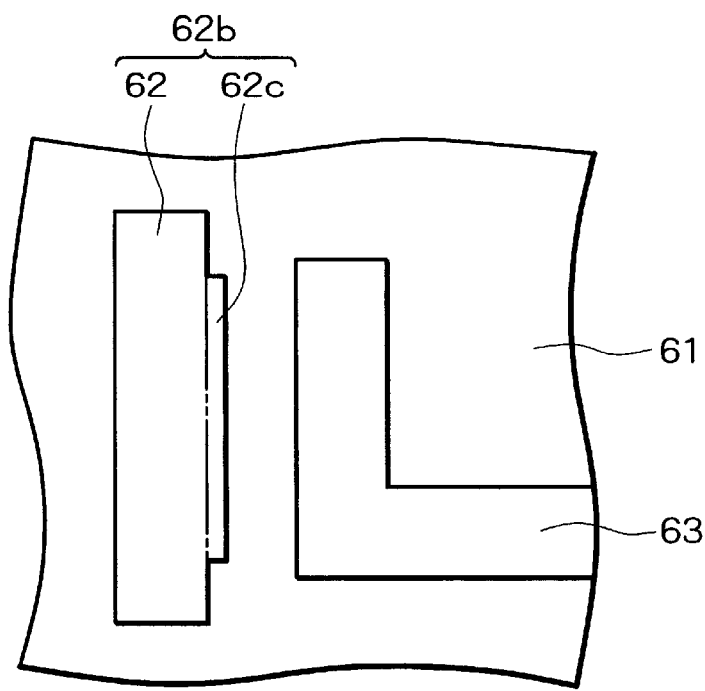
FIG. 2 is a plan view showing the form of the mask after correction.
Figure 3A:
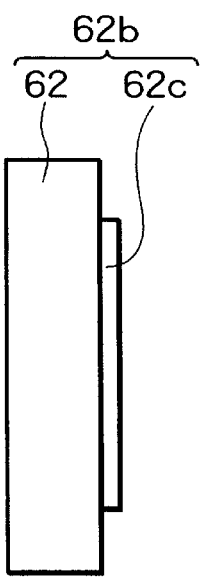
FIG. 3A and FIG. 3B are plan views showing the method of dividing the opening 62b.
Figure 3B:
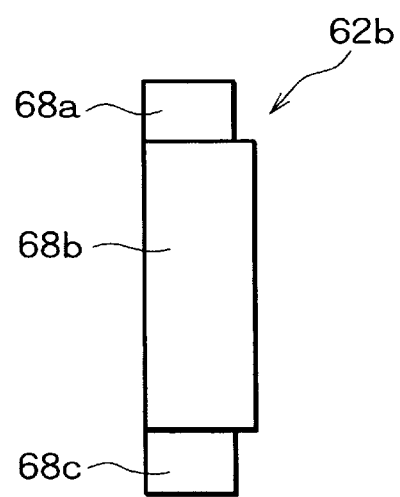
Figure 4A:
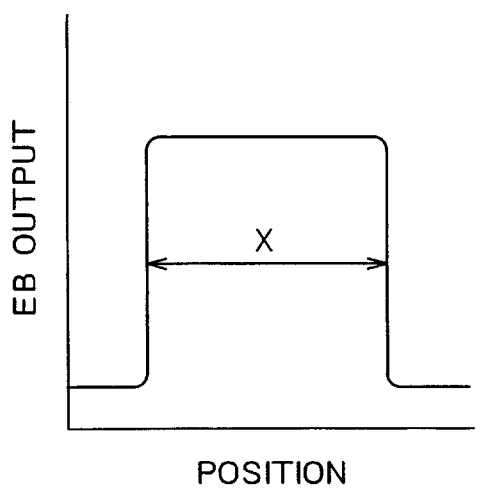
FIG. 4A and FIG. 4B are graphs showing the influence of the width of a rectangle produced by the division on the EB output characteristics, with the horizontal axis showing positions in the horizontal direction in a divided rectangle and the vertical axis showing the EB output, where
Figure 4B:
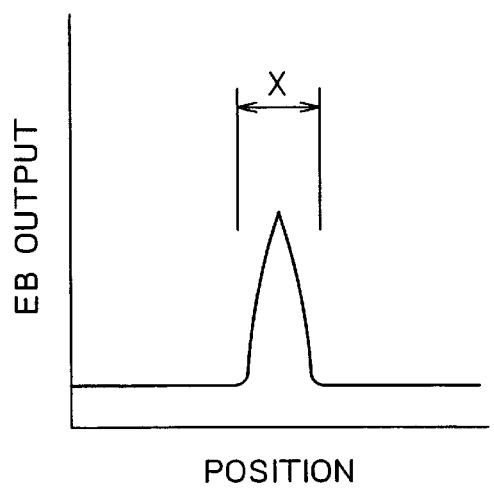
Figure 5:
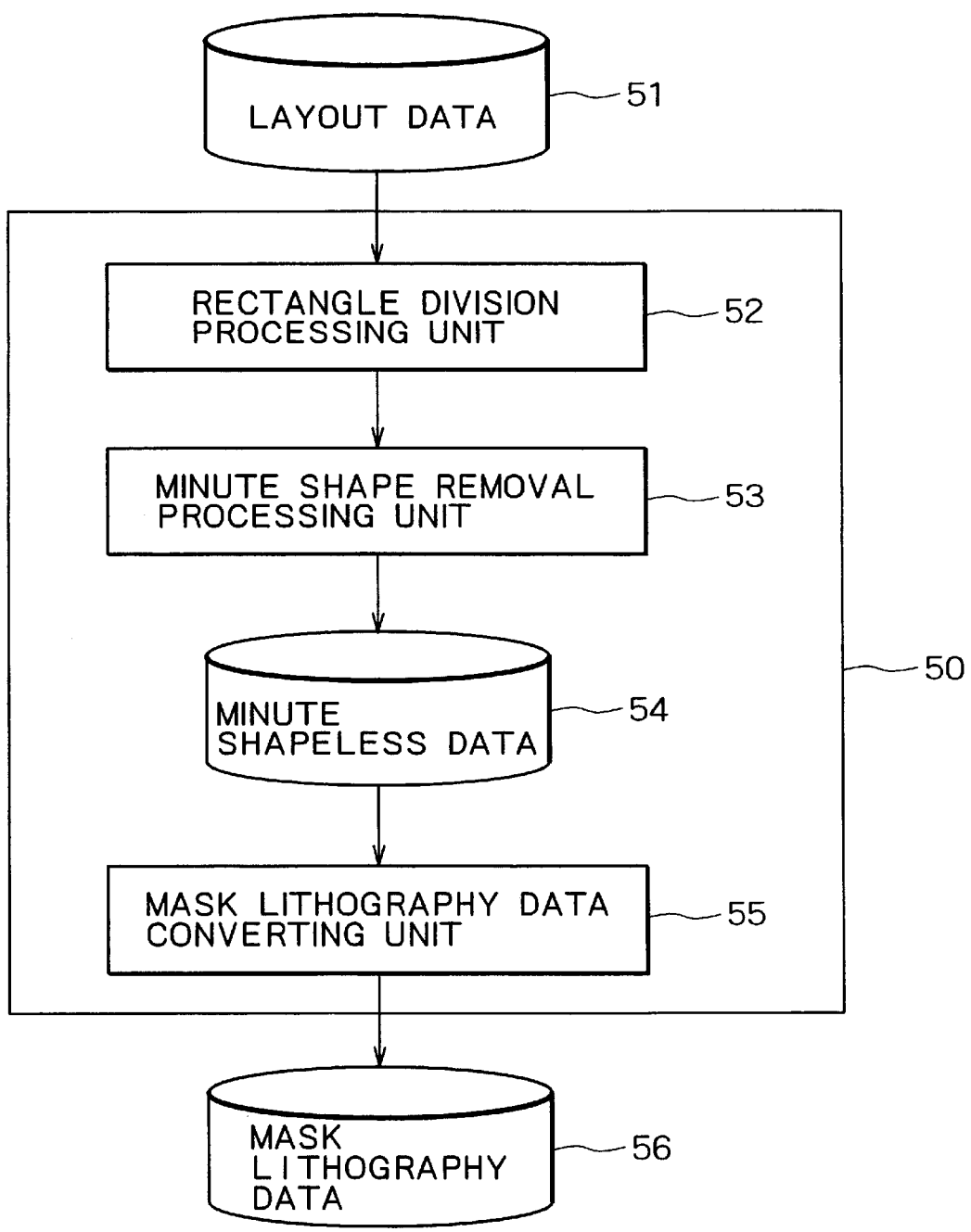
FIG. 5 is a block diagram showing a conventional mask lithography data generation apparatus.
Figure 6A:
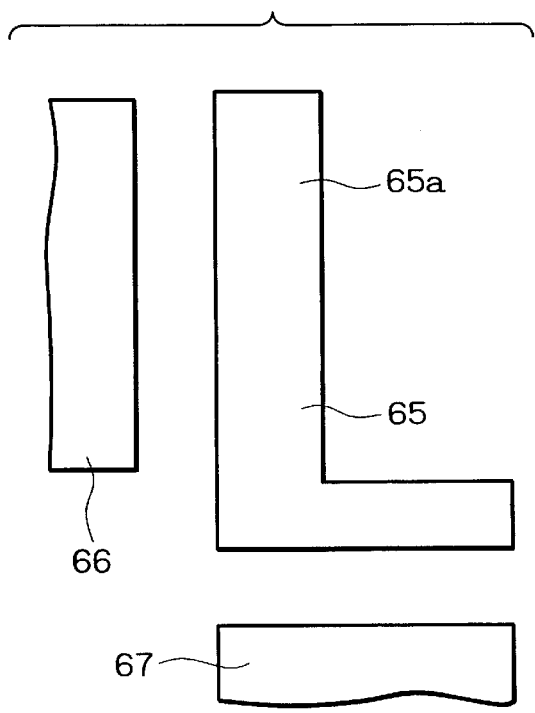
Figure 6B:
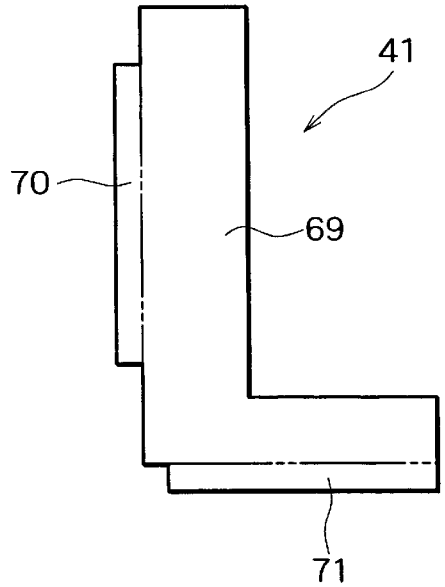
FIG. 6B shows the form of an opening in a mask for forming the resist pattern 65 shown in FIG. 6A.
Figure 7A:
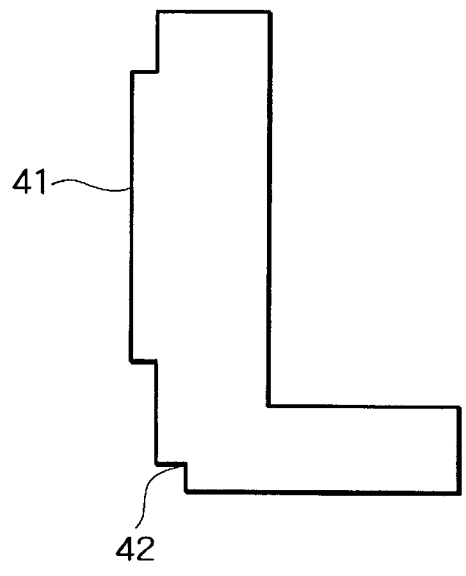
FIG. 7A and FIG. 7B are plan views showing the pattern of a mask, with FIG. 7A showing the pattern before division into rectangles and FIG. 7B showing the pattern after division into rectangles.
Figure 7B:
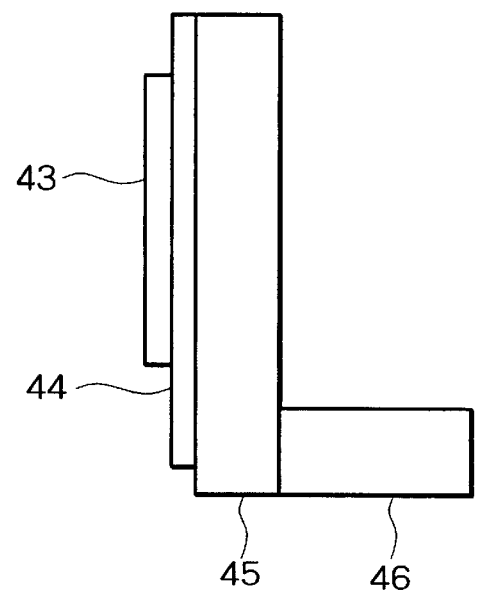

First, the layout data 21 (see FIG. 8) is generated. The layout data 21 is two-dimensional coordinate data showing the form of the pattern 1 shown in FIG. 10A. The pattern 1 is an estimated pattern for forming a mask used for EB lithography. The form of the pattern 1 is the same as the form of the pattern 41 shown in FIG. 7A, and so has a minute corner part 2.

Next, as shown in step S1 in FIG. 9, the layout data 21 is inputted into the rectangle division processing unit 22. Next, as shown by step S2 in FIG. 9 and FIG. 10B, the rectangle division processing unit 22 divides the pattern 1 into the rectangles 3 to 6. At this point, the rectangles 3 and 4 have narrow widths, making them minute shapes.

Next, as shown in step S3 in FIG. 9 and in FIG. 10C, the extraction processing unit 23 selects a region that is one part of the pattern 1 and sets the region as the selected region 7. In this way, the layout data 21 is divided into the selected data 25 that corresponds to the selected region 7 and the unselected data 24 that corresponds to the regions aside from the selected region 7. The selected region 7 is a region for which especially high formation precision is required in a semiconductor device, and for example can be the gate electrode of a transistor. It should be noted that this region is selected based on design data for a semiconductor device, such as layout data, etc., that is used in the field process.

Next, as shown in step S4 in FIG. 9, the minute shape removal processing unit 26 judges whether there is a minute shape in the selected region 7. At this point, the minute shape removal processing unit 26 measures the lengths of the sides of the rectangles in the selected region 7 and treats any rectangles with at least one side of a length shorter than a reference value as minute shapes. The reference value used changes depending on the EB lithography apparatus used, but can be 100 nm, for example. It should be noted that when the projection magnification is (¼) times, a length of 100 nm in the mask equates to a length of 25 nm on the wafer.

When there is no minute shape in the selected region 7, the following processing in steps S5 to S7 is omitted, and the processing advances to step S8. On the other hand, when there is a minute shape in the selected region 7, as shown in step S5 in FIG. 9, the minute shape is combined with rectangles that are in contact with the minute shape either directly or via another rectangle, and the combined result is regarded as a single figure. In the embodiment, as shown in FIG. 10B and 10C, the rectangles 3 and 4 that are minute shapes are present in the selected region 7, so that the minute shapes 3 and 4 and the rectangle 5 that is in contact with the rectangle 4 are combined within the selected region 7 to produce a single polygon 7a. By doing so, the rectangles 11 to 13 are also divided outside the selected region 7 in the pattern 1. It should be noted that steps S4 to S7 are executed by the minute shape removal processing unit 26.

Next, as shown in step S6 in FIG. 9, the polygon 7a is redivided into a plurality of rectangles using straight lines that join the vertices of the polygon 7a. After this, as shown in step S7 in FIG. 9, some or all of the plurality of rectangles produced by this redivision are combined to produce a larger combined rectangle. At this point, the plurality of rectangles are combined so that the lengths of the shortest sides in the combined rectangles are made as long as possible. In the embodiment, as shown in FIG. 10C, the combined rectangles 8 to 10 are formed in the selected region 7.

The processing next returns to step S4 in FIG. 9, where it is judged whether there is a minute shape in the selected region 7. When there is a minute shape in the selected region 7, the processing in steps S5 to S7 and step S4 are repeated. On the other hand, when there is no minute shape in the selected region 7, as shown in step S8 in FIG. 9, the selected data 25 and the unselected data 24 are inputted into the selected region merge processing unit 27. In the selected region merge processing unit 27, the selected data 25 and the unselected data 24 are combined (merged), thereby generating the minute shapeless data 28. By doing so, the figures in the selected region 7, which is to say, the combined rectangles 8 to 10, and the figures outside the selected region 7, which is to say, the rectangles 11 to 13, are recognized as a single figure.

Next, as shown in step S9 in FIG. 9, the minute shapeless data 28 is inputted into the mask lithography data converting unit 29. As a result, the mask lithography data converting unit 29 converts the minute shapeless data 28 into data in a format that can be recognized by a mask lithography apparatus (not shown in the drawings), thereby generating the mask lithography data 30. Next, as shown in step S10 in FIG. 9, the mask lithography data 30 is outputted to the mask lithography apparatus.

After this, based on the mask lithography data 30, the mask lithography apparatus performs EB lithography on a mask material made of silicon, for example. By doing so, a pattern is formed in the mask material and an electron beam exposure mask is produced.

In the present embodiment, the pattern 1 is divided into rectangles, and when minute shapes cannot be removed from the entire pattern 1 by such division, the pattern 1 is divided into a selected region 7 and a remaining region, and a minute shape removal process is performed for the selected region 7. As a result, when minute shapes cannot be removed from the entire pattern 1, minute shapes can still be removed from within the selected region 7. By doing so, the formation precision within the selected region 7 can be improved. As a result, if the selected region 7 is a region that corresponds to the gate electrode of a transistor, for example, the gate electrode can be formed precisely. In this way, faults in the characteristics, such as in the operating speed, of a transistor can be suppressed.

It should be noted that the form of the pattern 1 is not limited to an L-shape to which a corrective part has been added, so that the pattern 1 may have a variety of different forms. The selected region 7 is not limited to a region that corresponds to a gate electrode, and so may be a region that contains a contact or a via hole. In this case, the precision of the position at which the contact or via hole is formed can be improved. As a result, problems such as a poor connection due to the incorrect positioning of a contact or a via hole can be prevented.

What is claimed is:

1. A mask lithography data generation method for an electron beam exposure mask used in electron beam lithography where a polygon-shaped pattern is divided into rectangles, comprising the steps of:

dividing layout data that shows a form of said pattern into selected region data for a selected region and unselected region data for an unselected region, said selected region being a part of said pattern that needs to be formed precisely and said unselected region being a part of said pattern that may be formed less precisely than the selected region;

dividing said selected region data into a plurality of pieces of rectangle data by dividing said selected region into a plurality of rectangles whose shortest sides are longer than or equal to a reference value; and recombining said selected region data that has been divided into said plurality of pieces of rectangle data and said unselected region data.

2. The mask lithography data generation method according to claim 1, further comprising the step of converting the recombined layout data into mask lithography data.

3. The mask lithography data generation method according to claim 1, further comprising the step of dividing said unselected region data into a plurality of pieces of rectangle data.

4. The mask lithography data generation method according to claim 1, wherein the step of dividing said selected region data into the plurality of pieces of rectangle data by dividing said selected region into the plurality of rectangles whose shortest sides are longer than or equal to the reference value has the steps of:

dividing said selected region data into a plurality of pieces of rectangle data by dividing said selected region into a plurality of rectangles using lines that join vertices of said selected region;

combining some or all of the plurality of pieces of rectangle data to generate one or more larger pieces of rectangle data; and judging whether a length of a shortest sides in a rectangle represented by each of said larger pieces of rectangle data are longer than or equal to the predetermined value, and when the step of judging whether the length of the shortest sides are longer than or equal to the predetermined value judges that the length of the shortest side is below the predetermined value, the step of dividing said selected region data into the plurality of pieces of rectangle data by dividing said selected region into the plurality of rectangles using lines that join the vertices of said selected region, the step of generating the larger pieces of rectangle data, and the step of judging whether the length of the shortest side is at least equal to the predetermined value are repeated.

5. The mask lithography data generation method according to claim 1, wherein said electron beam exposure mask is a mask used when performing electron beam lithography on a semiconductor device, and said selected region is a region that corresponds to a gate electrode of a transistor of said semiconductor device.

6. The mask lithography data generation method according to claim 1, wherein said electron beam exposure mask is a mask used when performing electron beam lithography on a semiconductor device, and said selected region is a region that corresponds to a region including a contact in said semiconductor device.

7. The mask lithography data generation method according to claim 1, wherein said electron beam exposure mask is a mask used when performing electron beam lithography on a semiconductor device, and said selected region is a region that corresponds to a region including a via hole in said semiconductor device.

* * * * *